(12) United States Patent
Katsumata et al.

(10) Patent No.: US 6,250,914 B1
(45) Date of Patent: Jun. 26, 2001

(54) WAFER HEATING DEVICE AND METHOD OF CONTROLLING THE SAME

(75) Inventors: Hirofumi Katsumata, Fuji; Hideki Ito; Hidenori Takahashi, both of Numazu; Tadashi Ohashi, Kanagawa-ken; Shuji Tobashi, Sagamihara; Katsuyuki Iwata, Numazu, all of (JP)

(73) Assignees: Toshiba Machine Co., Ltd, Tokyo (JP); Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 09/556,943

(22) Filed: Apr. 21, 2000

(30) Foreign Application Priority Data

Apr. 23, 1999 (JP) .................................................. 11-116338

(51) Int. Cl.$^7$ ....................................................... F27D 7/06
(52) U.S. Cl. .............................. 432/5; 432/249; 118/725; 118/666; 219/444.1
(58) Field of Search ................................ 432/5, 245, 247, 432/249, 258, 259; 118/725, 730, 666; 219/444.1; 392/418, 419, 420, 421

(56) References Cited

U.S. PATENT DOCUMENTS

| | | | |
|---|---|---|---|
| 4,470,369 | * 9/1984 | Egerton ................................ | 118/725 |
| 5,716,207 | * 2/1998 | Mishina et al. ........................ | 432/5 |
| 5,937,142 | * 8/1999 | Moslehi et al. ....................... | 392/418 |
| 6,080,970 | * 6/2000 | Yoshida et al. .................... | 219/444.1 |
| 6,084,213 | * 7/2000 | Kohav et al. ......................... | 392/418 |
| 6,111,225 | * 8/2000 | Ohkase et al. ....................... | 118/725 |

FOREIGN PATENT DOCUMENTS 6-260426    9/1994   (JP) .

\* cited by examiner

*Primary Examiner*—Gregory Wilson
(74) *Attorney, Agent, or Firm*—Pillsbury, Winthrop LLP (57) ABSTRACT

The present invention provides a wafer heating device which can improve uniformity of a temperature distribution within a surface area of a wafer, with a relatively simple structure. A wafer is supported on a susceptor of annular shape. A first heater of disc shape is disposed below the wafer, and a second heater of annular shape is disposed to surround the first heater. Radiation thermometers are arranged at a ceiling portion of a reaction chamber. The first radiation thermometer measures a temperature of a central area of the wafer, the second radiation thermometer measures a temperature of a peripheral area of the wafer, and the third radiation thermometer measures a temperature of the susceptor. The first heater and the second heater are controlled by independent closed loops. When a wafer is set on the susceptor, a power of the second heater is controlled by using a value measured by the second radiation thermometer as a feedback signal. When no wafer is set on the susceptor, the power of the second heater is controlled by using a value measured by the third radiation thermometer as a feedback signal.

4 Claims, 5 Drawing Sheets

WAFER HEATING DEVICE AND METHOD OF CONTROLLING THE SAME

CROSS-REFERENCE TO RELATED APPLICATIONS

This application is based upon and claims the benefit of priority from the prior Japanese Patent Application No. 11-116338, filed Apr. 23, 1999, filed the entire contents of which are incorporated herein by reference.

BACKGROUND OF THE INVENTION

The present invention relates to a wafer heating device used in a semiconductor fabrication equipment, and a method of controlling the same.

Figure 1:
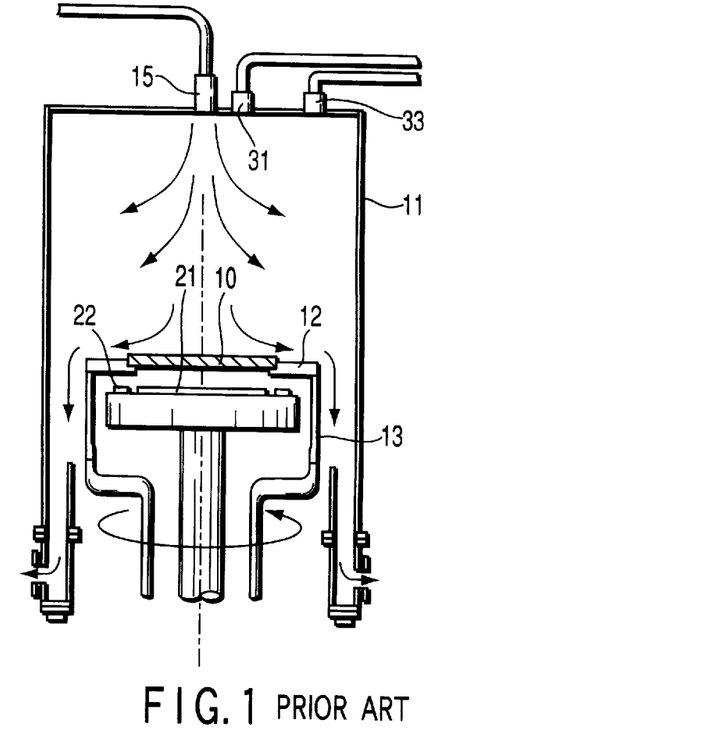
FIG. 1 shows an outline of an epitaxial growth system into which a conventional wafer heating device is integrated.

FIG. 1 shows an outline of a conventional epitaxial growth system. This system is used when a thin layer of silicon is deposited on a surface of a wafer.

An susceptor 12 of annular shape is disposed inside a reaction chamber 11. A wafer 10 is supported at the edge thereof on the susceptor 12. The susceptor 12 is supported at the edge thereof by a cylindrical drum 13, and mounted on a rotary drive mechanism (not shown) via the drum 13. With rotation of the susceptor 12, the wafer 10 held thereon is rotated.

Figure 2:
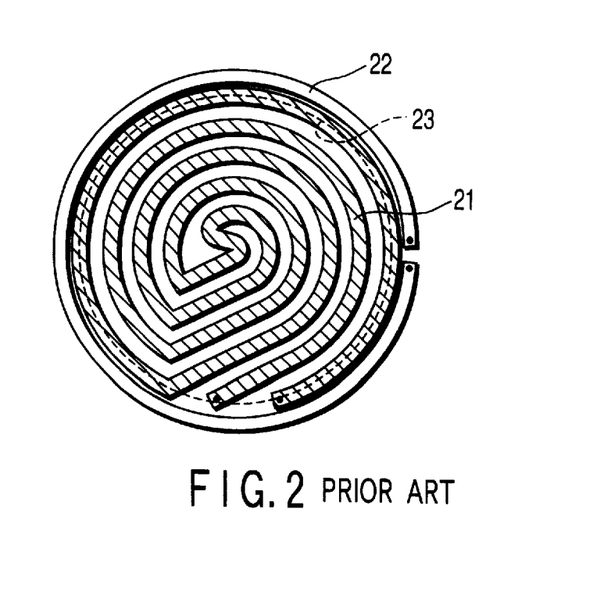
FIG. 2 is a plan view of a heater part of the wafer heating device shown in FIG. 1.

Within the drum 13, a first heater 21 is disposed in a position facing a lower surface of the wafer 10. As shown in FIG. 2, the first heater 21 is formed by arranging a heater in a spiral shape (or in a zigzag shape, or in a multiple-stripe shape), and has a disc shape as a whole. Further, a second heater 22 of annular shape is arranged so as to surround the first heater 21. The first heater 21 is used for heating the wafer 10. The second heater 22 is mainly used for heating the susceptor 12. The first heater 21 and the second heater 22 are not rotated.

A reaction gas supply nozzle 15 is provided at a ceiling portion of the reaction chamber 11. A silicon layer is deposited on the heated wafer 10 by supplying a reaction gas including silicon compound from this nozzle 15. Rotation of the wafer 10 promotes growth of the silicon layer, and improves uniformity of a thickness of the formed silicon layer.

Radiation thermometers 31 and 33 are mounted on the ceiling portion of the reaction chamber 11. A feedback control of powers of the first heater 21 and second heater 22 is performed by measuring surface temperatures of the wafer 10 and the susceptor 12 with these radiation thermometers 31 and 33.

FIG. 2 shows a plan view of the part of the first heater 21 and the second heater 22. In FIG. 2, reference numeral 21 denotes the first heater for heating the wafer, and 22 denotes the second heater mainly for heating the susceptor 12. A broken line 23 denotes an outer periphery of the wafer.

In a control method as described above, a temperature of the wafer can be accurately controlled in the vicinity of a measuring point of the temperature on the surface of the wafer 10. However, the temperature of the wafer cannot be accurately controlled in the other positions. Therefore, non-uniform temperature distribution occurs within the surface area of the wafer 10. In order to obtain an uniform thickness of a silicon layer to be formed, it is necessary to heat the wafer 10 not so as to generate a temperature difference within the surface area of the wafer 10. Large non-uniformity of the thickness of the formed silicon layer causes deterioration of quality and yield of semiconductor devices to be fabricated by using the wafer.

Recently, in order to improve chip multiprobe yield (an yield of devices per unit area of a wafer), the diameter of wafer is gradually increasing, such as 200 mm, 300 mm. In a wafer of a large diameter, it has become more difficult to heat the wafer uniformly within the surface area of the wafer.

Among factors which prevent uniform heating of the wafer, there is a phenomenon that heat flow is taken away from wafer via the susceptor supporting the edge of the wafer and that the temperature of the peripheral area of the wafer decreases. Since the susceptor has a larger thickness and a relatively larger heat capacity than those of the wafer, a large quantity of heat is taken from the wafer to the susceptor, and the temperature of the peripheral area of the wafer decreases. In order to prevent such decrease of the temperature in the peripheral area of the wafer, the second heater 22 for heating susceptor is provided.

Figure 3:
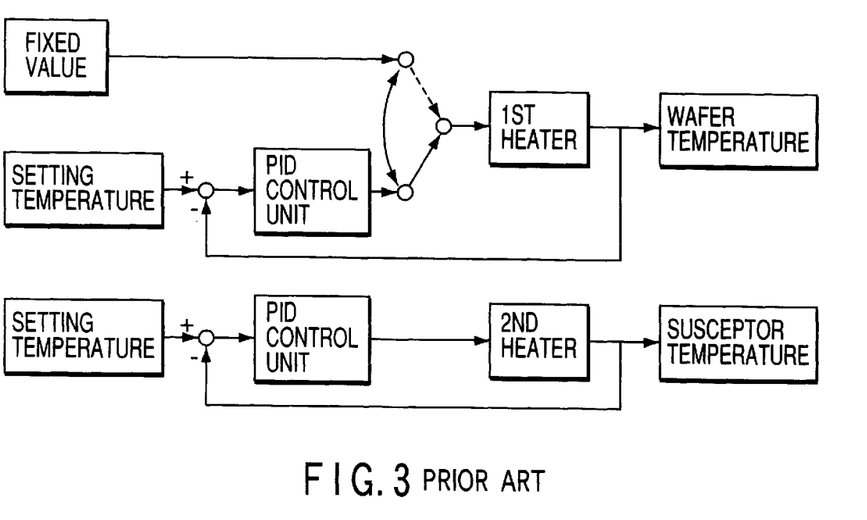
FIG. 3 is a control block diagram relating to a conventional wafer heating device.

FIG. 3 is an example of a control block diagram relating to powers of the first heater 21 and the second heater 22 in the above conventional semiconductor fabrication equipment. As shown in FIG. 3, the powers of the first heater 21 and the second heater 22 are independently controlled by separate PID-method closed loops. The power of the first heater 21 is controlled by using the temperature of the wafer 10 as a feedback signal, and the power of the second heater 22 is controlled by using the temperature of the susceptor 12 as a feedback signal. Further, when wafer 10 is not set on the susceptor, the power of the first heater 21 is fixed at a predetermined value.

A method of operating the semiconductor fabrication equipment shown in FIGS. 1–3 will be described.

The epitaxial growth system shown in FIG. 1 is a type of single wafer processing. The wafer 10 is treated one by one as follows. The wafer 10 is transferred into the reaction chamber 11 by a transfer robot (not shown). Then, a silicon layer is deposited on the surface of the wafer 10 in the reaction chamber 11. After deposition of the silicon layer has been completed, the wafer 10 is transferred from the reaction chamber 11 by the transfer robot. Thereafter, a new wafer is transferred into the reaction chamber 11, and a silicon layer is deposited again on the new wafer.

Figure 4:
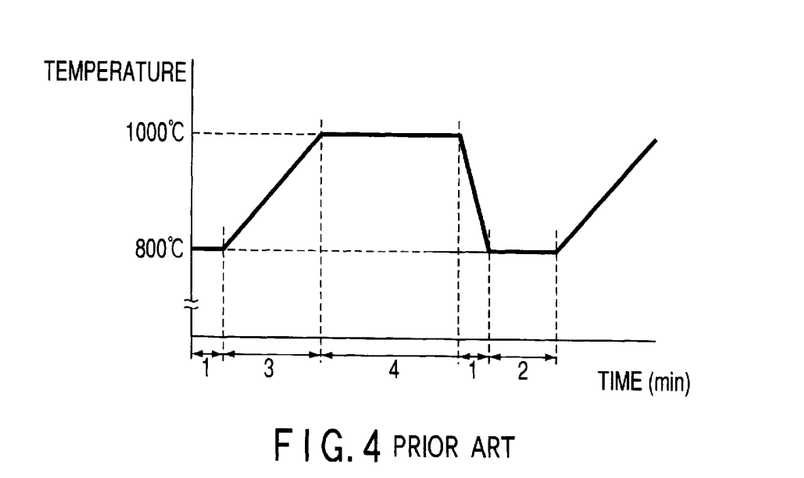
FIG. 4 shows an example of a pattern of a setting temperature of a wafer when the wafer is treated by using a semiconductor fabrication equipment of single wafer processing.

In a process of treating one wafer, a setting temperature of the wafer is program-controlled in accordance with a pattern as shown in FIG. 4, for example. In this example, the setting temperature of the wafer is set to 800° C. at first, and the temperature is maintained for 1 minute. However, since no temperature of the surface of the wafer is obtained while exchanging wafers, the power of the heater 31 is fixed at a predetermined value (for example, a value at which the temperature of a wafer is expected to be stabilized at about 800° C.). During this time, the wafer 10 is transferred into the reaction chamber 11 by the transfer robot (not shown) through a gate (not shown) located at the peripheral wall of the reaction chamber 11.

Figure 5:
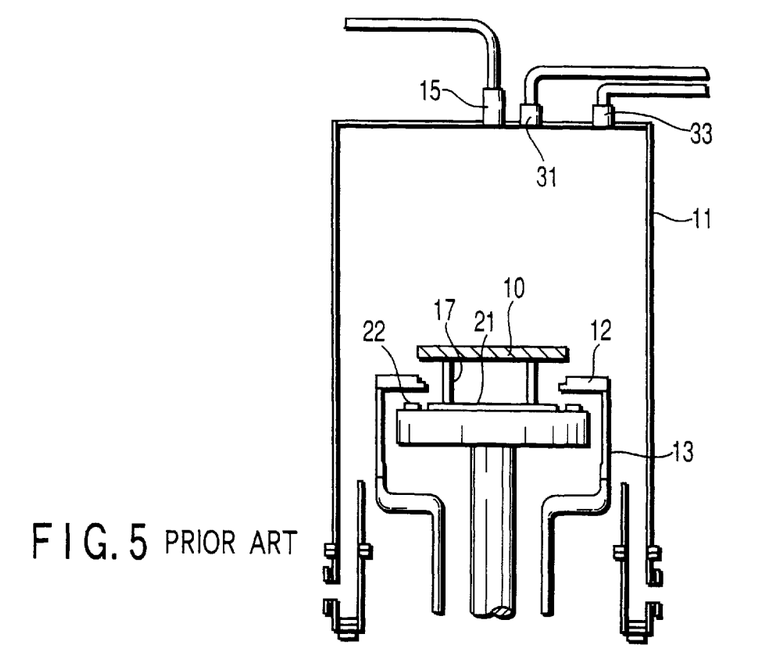
FIG. 5 is a diagram for explaining operation of the device when a wafer is set on the wafer heating device shown in FIG. 1.

FIG. 5 shows an operation of the system when the wafer 10 is transferred onto the susceptor 12. As shown in FIG. 5, pins 17 ascend from under the wafer 10, and receive the wafer 10 from the transfer robot. Thereafter, the transfer robot moves back to the outside of the reaction chamber 11, and the gate is closed. The wafer 10 is heated to a temperature close to 800° C. in a state of being set on the pins 17.

When the temperature of the wafer 10 has risen to nearly 800° C., pins 17 descend and the wafer 10 is transferred onto the susceptor 12. Next, rotation of the susceptor 12 is started. The temperature of the wafer 10 is maintained at 800° C. for 1 minute by a feedback control, as shown in FIG. 4. Then, the setting temperature value is linearly raised to 1000° C. for 3 minutes. If the wafer 10 is rapidly heated, the thermal stress increases, which causes deterioration of the quality of a silicon layer to be deposited. Therefore, the wafer is gradually heated as described above.

After the setting temperature value has reached 1000° C., the temperature is maintained for 4 minutes, during which a reaction gas including silicon compound is supplied onto the surface of the wafer 10. Thereby, a silicon layer is deposited on the wafer 10.

Then, supply of the reaction gas is stopped, and the setting temperature value is linearly lowered to 800° C. for 1 minute. After the setting temperature has been lowered to 800° C., the gate of the reaction chamber 11 is opened, pins 17 are raised, and the transfer robot is advanced, and the wafer 10 is transferred to the transfer robot.

(Problems of the conventional heater controlling method)

In the conventional heating device shown in FIGS. 1–4 and the temperature control method thereof, the temperature of the wafer is set in accordance with specification of semiconductor devices to be fabricated. At this time, it is not always easy to set the temperature of the susceptor to an optimum value. Usually, the setting temperature of the susceptor is set to be the same as the setting temperature of the wafer. However, in that case, since the heat capacity of the susceptor is greater than that of the wafer, rise of the temperature of the susceptor is behind that of the wafer. Thereby, heat flows out from the wafer to the susceptor, and the temperature of the peripheral area of the wafer decreases. Therefore, in order to prevent decrease of the temperature of the peripheral area, there are the cases where the setting temperature of the susceptor is set to a temperature which is tens degrees higher than that of the setting temperature of the wafer. If such a method is adopted, an optimum setting temperature of the susceptor needs to be determined by several trial-and-error processes.

Further, the temperature distribution in the reaction chamber changes with the lapse of the operation time of the system. Specifically, immediately after operation of the system is started, the whole system has not yet been heated, and thus a large heat flow is taken from the wafer via the susceptor. Therefore, the temperature of the peripheral area of the wafer greatly decreases. After several hours have passed since the start of the operation, the susceptor has been sufficiently heated, and the heat flow flowing out to the susceptor is reduced. Therefore, if the setting temperature of the susceptor is fixed at the temperature at which the operation was started, there are the cases where the temperature of the peripheral area of the wafer becomes higher than the temperature of the central area of the wafer (therefore, the setting temperature), by contraries.

From the above backgrounds, it is not easy to maintain the quality of the silicon layer deposited on the wafer, in a stable state for long time.

Figure 6:
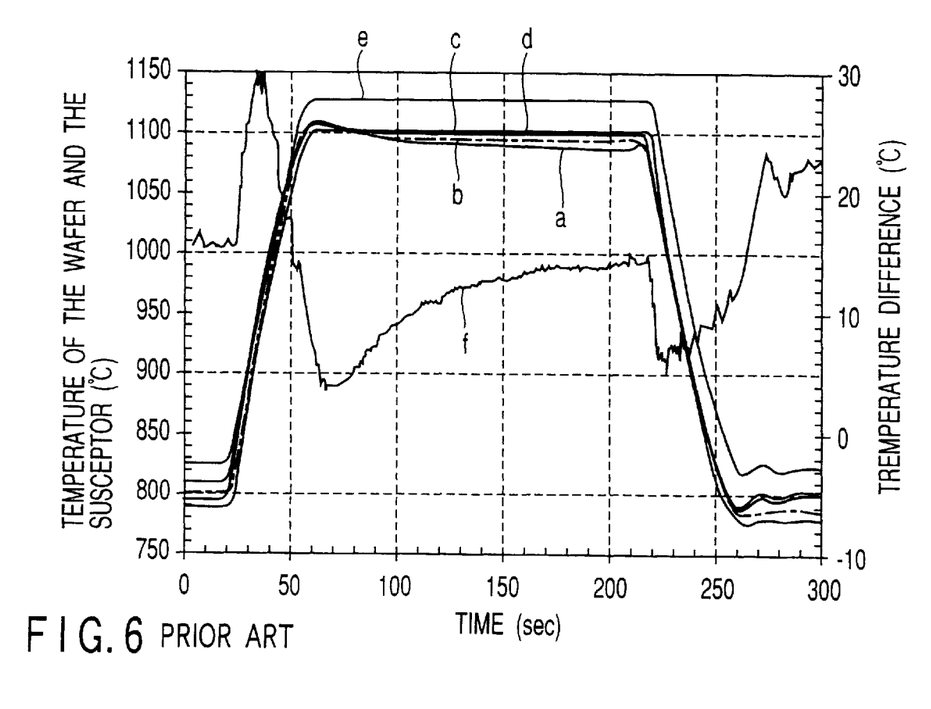
FIG. 6 shows an example of temperatures in several parts of a wafer when the wafer is treated by using a conventional wafer heating device.

FIG. 6 shows an example of results of temperature measurement. This graph shows variations of the temperatures (indicated by the left-hand scale) of several parts of the wafer and that of susceptor, in the case where the temperature of the wafer (diameter: 300 mm) is raised from 800° C. to 1100° C. and maintained at 1100° C. for 180 seconds. In this example, the setting temperature of the susceptor is higher than that of the wafer by 30° C.

In FIG. 6, line a denotes a temperature of an area 50 mm distant from the center of the wafer, line b denotes a temperature of an area 120 mm distant from the center of the wafer, line c denotes a temperature of an area 130 mm distant from the center of the wafer, and line d denotes an area 145 mm distant from the center of the wafer (peripheral area). Further, line e denotes a temperature of the susceptor. In FIG. 6, line f denotes a temperature difference within the wafer, specifically, the difference between the maximum value and the minimum value of the temperatures a–d (indicated by the right-hand scale). The power of the first heater 21 in the central area (FIG. 1) is feedback-controlled by using the measured value of the temperature c. In the meantime, the power of the second heater 22 in the peripheral area (FIG. 1) is feedback-controlled by using the measured value of the temperature e.

As shown in FIG. 6, the temperature of the feedback-controlled area (c) is constant. However, the temperature difference between the central area (a) of the wafer and the peripheral area (d) increases with the lapse of time, and a temperature difference greater than 10° C. occurs.

In order to shorten a cycle time per wafer and increase throughput, the temperature in the reaction chamber is maintained at a high temperature of a certain degree while exchanging wafers. When a wafer is transferred into the reaction chamber and set on the susceptor, if the temperature difference between the wafer and the susceptor is large, the wafer is deformed. Such deformation will be a main factor of increasing defects in crystal structure. Consequently, the deformation deteriorates the quality of a semiconductor device fabricated by using the wafer, and lowers the yield. Therefore, it is necessary to maintain the temperature of the susceptor at a proper value.

Instead of the temperature controlling method as described above, it is also possible to control the second heater 22 disposed outside (in FIG. 1) by using the temperature of the peripheral area of the wafer as the feedback signal. However, this method cannot be applied when no wafer is set on the susceptor.

Further, there is also a method of independently controlling heaters which are provided in correspondence with the central area of the wafer, the peripheral area of the wafer, and the susceptor. However, this method complicates the structure of the system and increases the manufacturing cost of the system. Further, since the peripheral area and the susceptor are adjacent to each other, interference occurs between two control loops thereof. Therefore, it is not always easy to independently control the heaters corresponding to the peripheral area and the susceptors.

BRIEF SUMMARY OF THE INVENTION

The present invention has been made in consideration of the problems of the method of controlling the conventional wafer heating device as described above. The object of the present invention is to provide a wafer heating device which can improve uniformity of a temperature distribution within the surface area of wafer with a relatively simple structure, without sacrificing productivity.

A wafer heating device of the present invention comprises:

a susceptor having annular shape for supporting a wafer at an edge thereof;

a first heater disposed to face a lower surface of the wafer;

a second heater having annular shape disposed along an outer periphery of the first heater;

a temperature control unit for controlling powers of these heaters;

a first radiation thermometer for measuring a temperature of a central area of the wafer;

a second radiation thermometer for measuring a temperature of a peripheral area of the wafer; and a third radiation thermometer for measuring a temperature of the susceptor, wherein: when there is no wafer on or above the susceptor, the temperature control unit fixes the power of the first heater at a predetermined value, and controls the second heater by using an output of the third radiation thermometer as a feedback signal;

when the wafer is held above the susceptor, the temperature control unit controls the first heater by using an output of the first radiation thermometer as a feedback signal, and controls the second heater by using the output of the third radiation thermometer as the feedback signal; and when the wafer is set on the susceptor, the temperature control unit controls the first heater by using the output of the first radiation thermometer as the feedback signal, and controls the second heater by using an output of the second radiation thermometer as a feedback signal.

Preferably, the wafer is held above the susceptor before the wafer is set on the susceptor, and the wafer is set on the susceptor after a difference between the temperature of the central area of the wafer (measured by the first radiation thermometer) and the temperature of the susceptor (measured by the third radiation thermometer) has fallen within 50° C.

A single radiation thermometer can be used both as the second radiation thermometer and as the third radiation thermometer. In this case, the single radiation thermometer is supported by a turning mechanism to detect temperatures of the areas to be measured.

According to the wafer heating device of the present invention, when there is a wafer on or above the susceptor, the power of the first heater is controlled by using the temperature of the central area of the wafer as the feedback signal. When there is no wafer on or above the susceptor, the power of the first heater is fixed at zero or a predetermined value.

Further, when a wafer is set on the susceptor, the power of the second heater is controlled by using the temperature of the peripheral area of the wafer as a feedback signal. Therefore, temperature uniformity within the surface area of the wafer can be improved.

When no wafer is set on the susceptor, the power of the second heater is controlled by using the temperature of the susceptor as a feedback signal.

Therefore, when a wafer is lowered onto the susceptor, if the temperature of the wafer is made close to the temperature of the susceptor, deformation of the wafer due to temperature difference between the wafer and the susceptor can be prevented.

As described above, uniformity of a temperature distribution within the surface area of wafer can be improved with a relatively simple structure, without sacrificing productivity, by switching feedback signals used for closed-loop control of the second heater which is provided for heating the peripheral area of the wafer and the susceptor, in accordance with whether a wafer is set on the susceptor or not.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 7:
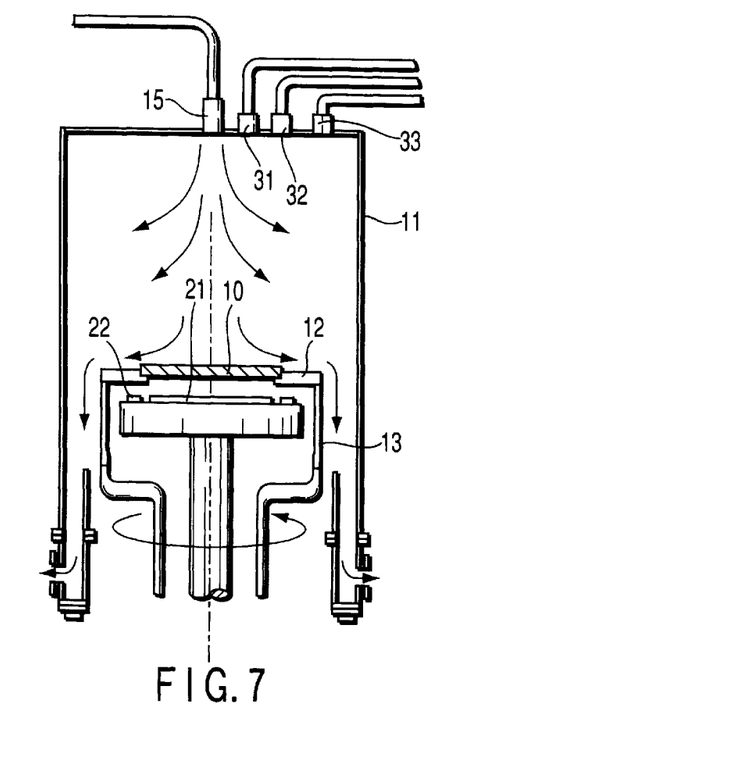
FIG. 7 shows an outline of an epitaxial growth system into which a wafer heating device according to the present invention is integrated.

FIG. 7 shows an example of an epitaxial growth system into which a wafer heating device according to the present invention is integrated. In FIG. 7, reference numeral 10 denotes a wafer, 12 denotes a susceptor, 21 denotes a first heater, 22 denotes a second heater, 31 denotes a first radiation thermometer, 32 denotes a second radiation heater, and 33 denotes a third radiation thermometer.

Within a reaction chamber 11, a susceptor having annular shape 12 is disposed. The wafer 10 is supported at the edge thereof on the susceptor 12. The susceptor 12 is supported at the edge thereof by a cylindrical drum 13, and mounted on a rotary drive mechanism (not shown) via the drum 13.

Within the drum 13, the first heater 21 having a disk shape as a whole is disposed in a position facing a lower surface of the wafer 10. The second heater 22 having annular shape is disposed so as to surround the first heater 21. The first heater 21 is used for heating the wafer 10, and the second heater 22 is used for heating a peripheral area of the wafer 10 and the susceptor 12. The first heater 21 and the second heater 22 are not rotated.

A reaction gas supply nozzle 15 is provided at a ceiling portion of the reaction chamber 11. The first radiation thermometer 31, the second radiation thermometer 32 and the third radiation thermometer 33 are also provided at the ceiling portion of the reaction chamber 11. Among these thermometers, the first radiation thermometer 31 measures a temperature of a central area of the wafer 10, the second radiation thermometer measures a temperature of the peripheral area of the wafer 10, and the third radiation thermometer measures a temperature of a surface of the susceptor 12.

Figure 8:
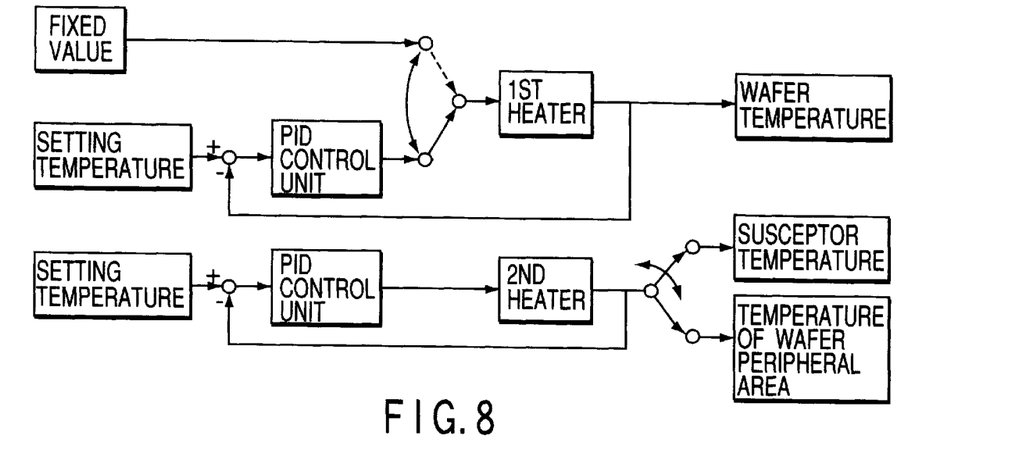
FIG. 8 is a control block diagram relating to the wafer heating device according to the present invention.

FIG. 8 is a control block diagram of powers of the first heater 21 and second heater 22 in the above wafer heating device. As shown in FIG. 8, the first heater 21 and the second heater 22 are controlled by independent PID-method closed loops. The power of the first heater 21 is controlled by using the temperature of the central area of the wafer as a feedback signal, or a fixed at a predetermined value, in accordance with a step being performed in the reaction chamber 11. The power of the second heater 22 is controlled by switching feedback signals between the temperature of the peripheral area of the wafer 10 and the susceptor 12, in accordance with a step being performed in the reaction chamber 11.

Then, a method of operating the wafer heating device shown in FIG. 7 and FIG. 8 will now be described. Values of temperature and time, in the following description are only mentioned as examples, and do not restrict the scope of the present invention.

First, in a stage before the wafer 10 is transferred into the reaction chamber 11, the power of the first heater 21 is controlled by an open loop, and the reaction chamber 11 is heated to a predetermined temperature. The power of the second heater 22 is feedback-controlled with an objective temperature set to 800° C., by using an output of the third radiation thermometer (the temperature of the susceptor 12) as the feedback signal.

Then, a gate (not shown) of the reaction chamber 11 is opened, and the wafer 10 is transferred into the reaction chamber 11 by using a transfer robot (not shown). The transfer robot transfers the wafer 10 onto pins 17 (FIG. 5), and thereafter moves back to the outside of the reaction chamber 11. Thereafter, the gate is closed.

Next, a control loop of the first heater 21 is switched, and the power of the first heater 21 is controlled with a setting temperature of 800° C., by using the output of the first radiation thermometer (the temperature of the central area of the wafer 10) as the feedback signal. Thereby, the wafer 10 is heated to 800° C. in a state of being set on the pins 17 (FIG. 5).

When the output of the first radiation thermometer 31 (the temperature of the central area of the wafer 10) reaches 800° C., the pins 17 are lowered and the wafer 10 is transferred onto the susceptor 12. At this time, since the temperature of the wafer 10 has already been the same as the temperature of the susceptor 12, there is no fear that the wafer 10 deforms due to thermal strain.

Then, a control loop of the second heater 22 is switched, and the power of the second heater 22 is controlled by using the output of the second radiation thermometer 32 (the temperature of the peripheral area of the wafer 10) as the feedback signal. Simultaneously, rotation of the susceptor 12 is started. Then, the setting temperature values of the central area of the wafer 10 and the peripheral area of the wafer 10 are linearly raised to 1000° C.

After the output of the first radiation thermometer 31 and the output of the second radiation thermometer 32 reach 1000° C., this temperature is maintained. While maintaining the temperature, a reaction gas including silicon compound is supplied onto the surface of the wafer 10, and a silicon layer is deposited on the wafer 10.

Thereafter, supply of the reaction gas is stopped, and the setting temperature values are linearly lowered to 800° C. After the setting temperatures have been lowered to 800° C., the gate of the reaction chamber 11 is opened, the pins 17 are raised, and thereafter the transfer robot is advanced and the wafer is transferred to the transfer robot.

As described above, a temperature control point is provided to each of the central area and the peripheral area of the wafer, the fist heater 21 is controlled by using the temperature of the central area (the output of the first radiation thermometer 31) as the feedback signal, and the second heater 22 is controlled by using the temperature of the peripheral area (the output of the second radiator thermometer 32) as the feedback signal. Thereby, uniformity of temperature distribution within the surface area of the wafer 10 can be improved in comparison with prior art.

Figure 9:
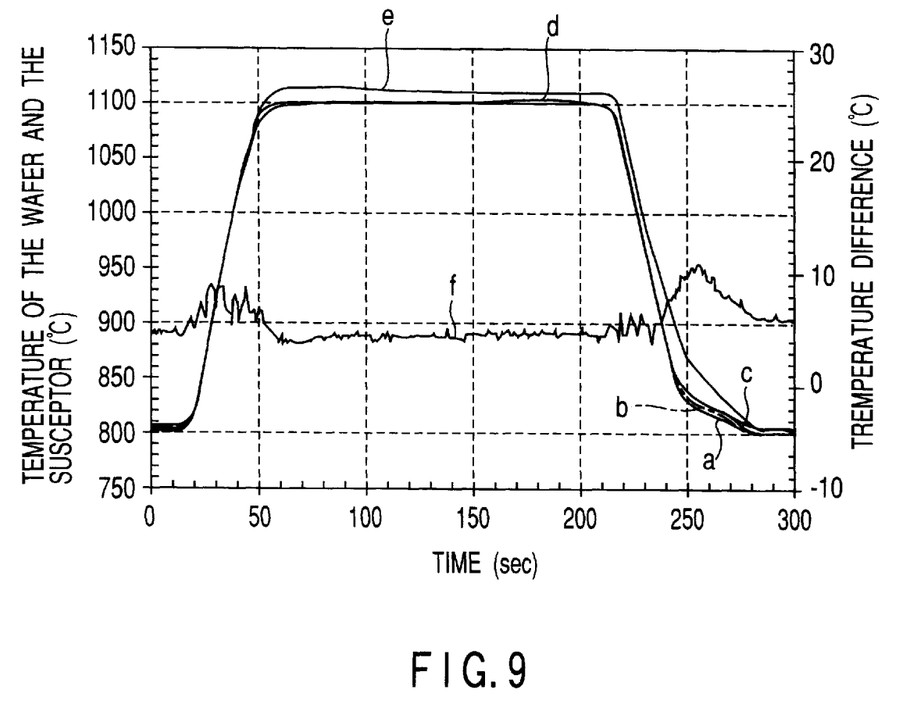
FIG. 9 shows an example of temperatures in several parts of a wafer when the wafer is treated by using the wafer heating device according to the present invention.

FIG. 9 shows results of temperature measurements in several parts of the wafer (indicated by the left-hand scale) when a wafer (diameter: 300 mm) is treated by using the above wafer heating device. In this case, the setting temperature of the wafer is linearly raised from 800° C. to 1100° C., and maintained at 1100° C. for 180 seconds. In FIG. 9, line a denotes a temperature of an area 50 mm distant from the center of the wafer (the central area), line b denotes a temperature of an area 120 mm distant from the center of the wafer, line c denotes a temperature of an area 130 mm distant from the center of the wafer, and line d denotes a temperature of an area 145 mm distant from the center of the wafer (the peripheral area). Line e denotes a temperature of the susceptor 12. Line f denotes a temperature difference within the wafer, specifically, a difference between the maximum value and the minimum value of the temperatures a–d (indicated by the right-hand scale).

As shown in FIG. 9, the temperature difference (f) within the surface area of the wafer is smaller than that of the prior art (FIG. 6).

In the above embodiment, the second radiation thermometer 32 for measuring the temperature of the peripheral area of the wafer and the third radiation thermometer 33 for measuring the temperature of the susceptor are separately provided, and their outputs are alternately switched to be used as the feedback signal of the second heater. However, a single radiation thermometer can be used as these radiation thermometers. In that case, this radiation thermometer is mounted on the ceiling portion of the reaction chamber 11 via a turning mechanism, and a direction of the radiation thermometer is automatically turned in accordance with a step being performed within the reaction chamber 11.

According to the wafer heating device of the present invention, when the wafer is set on the susceptor, the powers of the first heater and the second heater are controlled by using the temperatures of the central area and the peripheral area of the wafer as the feedback signals. Therefore, the uniformity of the temperature distribution of within the surface area of the wafer can be improved in comparison with the prior art.

When no wafer is set on the susceptor, the power of the second heater is controlled by using the temperature of the susceptor as the feedback signal, and thereby the temperature of the susceptor can be maintained at a constant value.

Further, when a wafer is lowered onto the susceptor, the temperature of the wafer can be made close to the temperature of the susceptor by using the first heater in advance of lowering the wafer. Consequently, deformation of the wafer due to the temperature difference between the wafer and the susceptor can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wafer heating device comprising:
   a susceptor having an annular shape for supporting a wafer at an edge thereof;
   a first heater disposed to face a lower surface of the wafer;
   a second heater having an annular shape disposed along an outer periphery of the first heater;
   a temperature control unit for controlling powers of these heaters;
   a first radiation thermometer for measuring a temperature of a central area of the wafer;
   a second radiation thermometer for measuring a temperature of a peripheral area of the wafer; and
   a third radiation thermometer for measuring a temperature of the susceptor,
   wherein: when there is no wafer on or above the susceptor, the temperature control unit fixes the power of the first heater at a predetermined value, and controls the second heater by using an output of the third radiation thermometer as a feedback signal;
   when the wafer is held above the susceptor, the temperature control unit controls the first heater by using an output of the first radiation thermometer as a feedback signal, and controls the second heater by using the output of the third radiation thermometer as the feedback signal; and
   when the wafer is set on the susceptor, the temperature control unit controls the first heater by using the output of the first radiation thermometer as the feedback signal, and controls the second heater by using an output of the second radiation thermometer as a feedback signal.

2. A wafer heating device of claim 1, wherein a single radiation thermometer is used both as the second radiation thermometer and as the third radiation thermometer, and said single radiation thermometer is supported by a turning mechanism to detect temperatures of the areas to be measured.

3. A method of controlling a wafer heating device which has a susceptor having an annular shape for supporting a wafer at an edge thereof, a first heater disposed to face a lower surface of the wafer, and a second heater having an annular shape disposed along an outer periphery of the first heater,
   the method comprising the steps of:
      fixing, when there is no wafer on and above the susceptor, the power of the first heater at a predetermined value, and controlling the second heater by using a temperature of the susceptor as a feedback signal;
      controlling, when the wafer is held above the susceptor, the first heater by using a temperature of a central area of the wafer as a feedback signal, and controlling the second heater by using the temperature of the susceptor as the feedback signal; and
      controlling, when the wafer is set on the susceptor, the first heater by using the temperature of the central area of the wafer as the feedback signal, and controlling the second heater by using a temperature of a peripheral area of the wafer as a feedback signal.

4. A method of claim 3, wherein the wafer is held above the susceptor before the wafer is set on the susceptor, and the wafer is set on the susceptor after a difference between the temperature of the central area of the wafer and the temperature of the susceptor has fallen within 50° C.

* * * * *